(12) United States Patent
Ahn

(10) Patent No.: US 7,589,748 B2
(45) Date of Patent: Sep. 15, 2009

(54) IMAGE SENSOR WITH SCALER AND IMAGE SCALING METHOD THEREOF

(75) Inventor: Hyun-Joo Ahn, Chungcheongbuk-do (KR)

(73) Assignee: Crosstek Capital, LLC, Wilmington, DE (US)

( * ) Notice: Subject to any disclaimer, the term of this patent is extended or adjusted under 35 U.S.C. 154(b) by 117 days.

(21) Appl. No.: 11/319,553

(22) Filed: Dec. 29, 2005

(65) Prior Publication Data

US 2006/0187503 A1    Aug. 24, 2006

(30) Foreign Application Priority Data

Feb. 24, 2005    (KR)  ................  10-2005-0015506

(51) Int. Cl.
    *G09G 5/00* (2006.01)
(52) U.S. Cl. ............... 345/660; 345/661; 345/619; 382/232; 348/222.1; 348/308
(58) Field of Classification Search ...... 348/222.1–308; 382/232; 345/660–661
    See application file for complete search history.

(56) References Cited

U.S. PATENT DOCUMENTS

| | | | |
|---|---|---|---|
| 6,914,632 B1 * | 7/2005 | Kim | 348/308 |
| 7,171,050 B2 * | 1/2007 | Kim | 382/232 |
| 2002/0158973 A1 * | 10/2002 | Gomi | 348/240.2 |
| 2003/0007081 A1 * | 1/2003 | Kwon et al. | 348/247 |
| 2003/0174226 A1 * | 9/2003 | Ahn et al. | 348/294 |
| 2003/0179939 A1 * | 9/2003 | Kim | 382/232 |
| 2005/0152197 A1 * | 7/2005 | Cho et al. | 365/221 |
| 2005/0190270 A1 * | 9/2005 | Park | 348/222.1 |
| 2006/0158537 A1 * | 7/2006 | Watanabe | 348/272 |

FOREIGN PATENT DOCUMENTS

JP    11-146278    5/1999

* cited by examiner

*Primary Examiner*—Jin-Cheng Wang
(74) *Attorney, Agent, or Firm*—Turocy & Watson LLP

(57) ABSTRACT

An image sensor is widely used in many fields, including the medical field and the security device field. Specifically, the image sensor is most widely used in digital cameras and mobile phones. The digital camera and the mobile phone require capturing images of higher resolution and higher quality. However, a preview size of the mobile phone or digital camera should be small because of a display limitation. Therefore, a function for reducing an image size or magnifying a specific portion of the picture is essential in the image sensor. Accordingly, there is provided an image sensor with a scaler. The image sensor with the scaler can arbitrarily adjust a size of an image without any additional scaling chip.

12 Claims, 12 Drawing Sheets

IMAGE SENSOR WITH SCALER AND IMAGE SCALING METHOD THEREOF

CROSS REFERENCE TO RELATED APPLICATION

The present application claims priority to and the benefit of Korean patent application No. KR 2005-0015506, filed in the Korean Patent Office on Feb. 24, 2005, the entire content of which is incorporated herein by reference.

FIELD OF THE INVENTION

The present invention relates to a CMOS image sensor; and, more particularly, to a CMOS image sensor with a scaler and an image scaling method thereof.

DESCRIPTION OF THE RELATED ART

An image sensor is an apparatus to capture images using light sensing semiconductor materials. Since brightness and wavelength of light from an object are different in their amount according to the reflection area, electrical signals from pixels are different from one another. These electrical signals are converted into digital signals, which can be processed in a digital circuit.

FIG. 1 is a block diagram of an image sensor.

Referring to FIG. 1, the image sensor includes a pixel array 10 with M×N unit pixels (M and N are positive integers), a timing controller 11, an analog signal processor 12, an image signal processor 14, and a line memory 13.

The analog signal processor 12 is provided with a correlated double sampling (CDS) and analog amplifier 121, and an analog-to-digital converter (ADC) 122.

The timing controller 11 is called a control and external system interface. The timing controller 11 controls an overall operation of the image sensor using a finite state machine (FSM) and serves as an interface for an external system. Also, since the timing controller 11 has a batch register, it can program contents related to several internal operations and controls an overall chip operation according to the program information.

The pixel array 10 includes M×N unit pixels configured to maximize light-sensitive characteristics. The pixel array 10 is a core of the image sensor and detects information about an image inputted from the outside.

In the CDS and analog amplifier 121, the CDS removes a fixed pattern noise of a pixel using a CDS method, and the analog amplifier converts a pixel signal into an electric signal.

The ADC 122 converts an analog voltage detected by each pixel of the pixel array 10 into a digital voltage that can be processed at a digital system.

The line memory 13 stores the digital voltage of the pixel, which is converted by the ADC 122. The line memory 13 includes a plurality of lines for executing various functions of the image signal processor 14.

The image signal processor 14 executes several functions for improving the performance of the image sensor, based on the pixel output value stored in the line memory 13. Examples of the functions are a color interpolation, a color correction, a gamma correction, an auto white balance, an auto exposure, and so on.

Generally, a camera system using an image sensor includes an image sensor and a back-end chip. The image sensor converts an optical signal into an electric signal, and transfers the corresponding image information. The back-end chip receives the image information from the image sensor, enhances an image picture, compresses the information, and adjusts an image size. In the image sensor, the number of pixels has increased up to million pixels and continually increases rapidly. However, a preview size of a mobile phone or digital camera should be small because of a display limitation. Therefore, the image scaling becomes important in the back-end chip.

However, after the image information of one picture from the image sensor is all stored, the back-end chip has to adjust the image size. Therefore, a long time is taken for the image scaling. An operation speed of the image sensor is limited due to the speed of the image scaling processed by the back-end chip. Consequently, a frame rate of the image sensor is degraded and a picture is broken in the preview of the mobile phone or digital camera.

SUMMARY OF THE INVENTION

It is, therefore, an object of the present invention to provide an image sensor with an embedded scaling function and an image scaling method thereof, in which the scaling can be executed without any additional scaler chip.

In accordance with an aspect of the present invention, there is provided an image sensor including: a pixel array having a plurality of pixels formed to maximize light sensing characteristic, the pixel array being configured to detect information on an external image; a timing controller for controlling an overall operation of the image sensor; an analog signal processor for converting an analog signal from the pixel array into a corresponding digital signal under control of the timing controller; a line memory for storing the digital signal in line unit; an image signal processor for processing a plurality of images by using the digital signal stored in the line memory so as to improve performance of the image sensor; and a scaler for receiving a scaling factor of a desired image size from the timing controller and calculating a scaling ratio so as to adjust an image size, and generating a corresponding row/column address and data and scaling the image stored in the line memory, whereby the image with the desired size is outputted.

In accordance with another aspect of the present invention, there is provided an image scaling method of an image sensor, including: calculating a scaling ratio corresponding to scaling factors (SCALEM, SCALEN) for outputting an image with a desired size, wherein the scaling ratio is SCALEM/SCALEN; determining whether to execute a pre-scaling according to the scaling ratio; when the pre-scaling is necessary to execute, executing the pre-scaling to adjust the size of the image; determining whether to execute a post-scaling; when the post-scaling is necessary to execute, executing the post-scaling to adjust the size of the image; and synchronizing image data scaled through the pre-scaling and the post-scaling with an output clock of the image sensor.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

An image sensor with a scaler and an image scaling method thereof in accordance with exemplary embodiments of the present invention will be described in detail with reference to the accompanying drawings.

Figure 1:
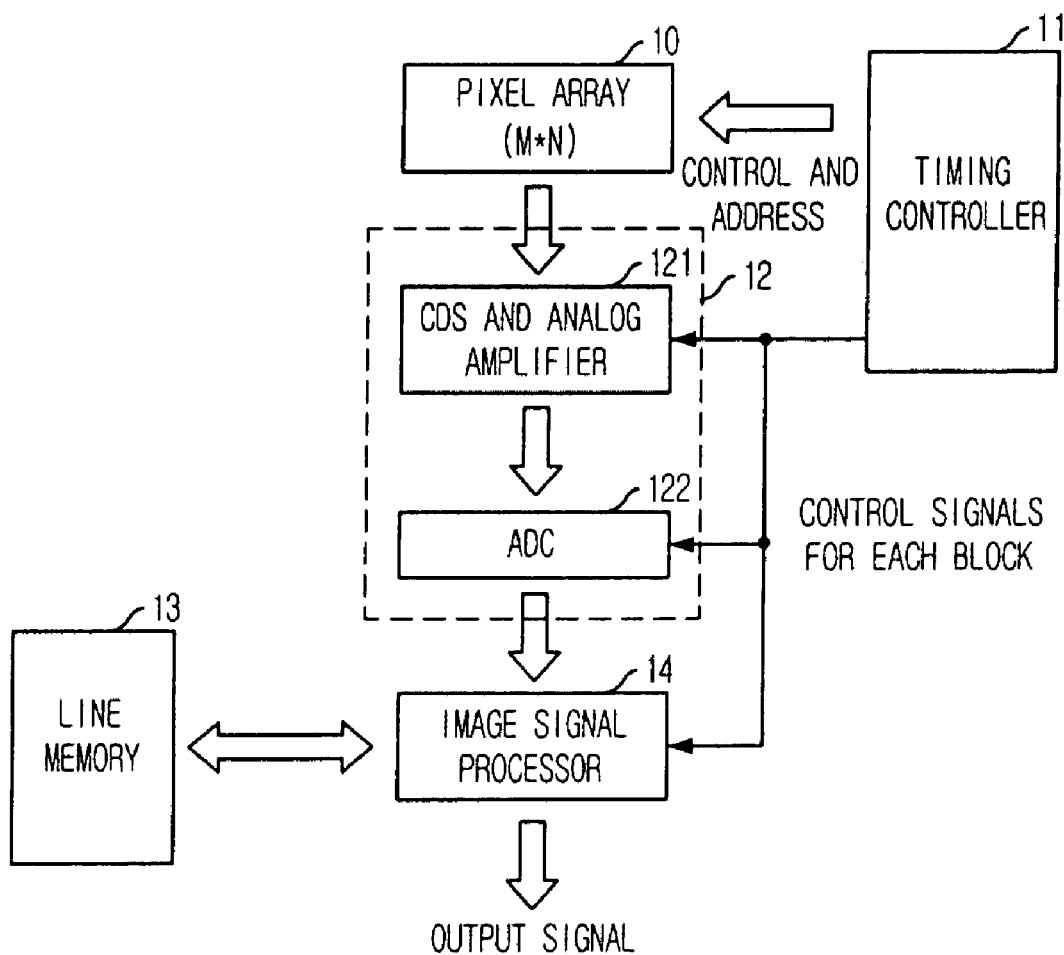
FIG. 1 is a block diagram of an image sensor.
Figure 2:
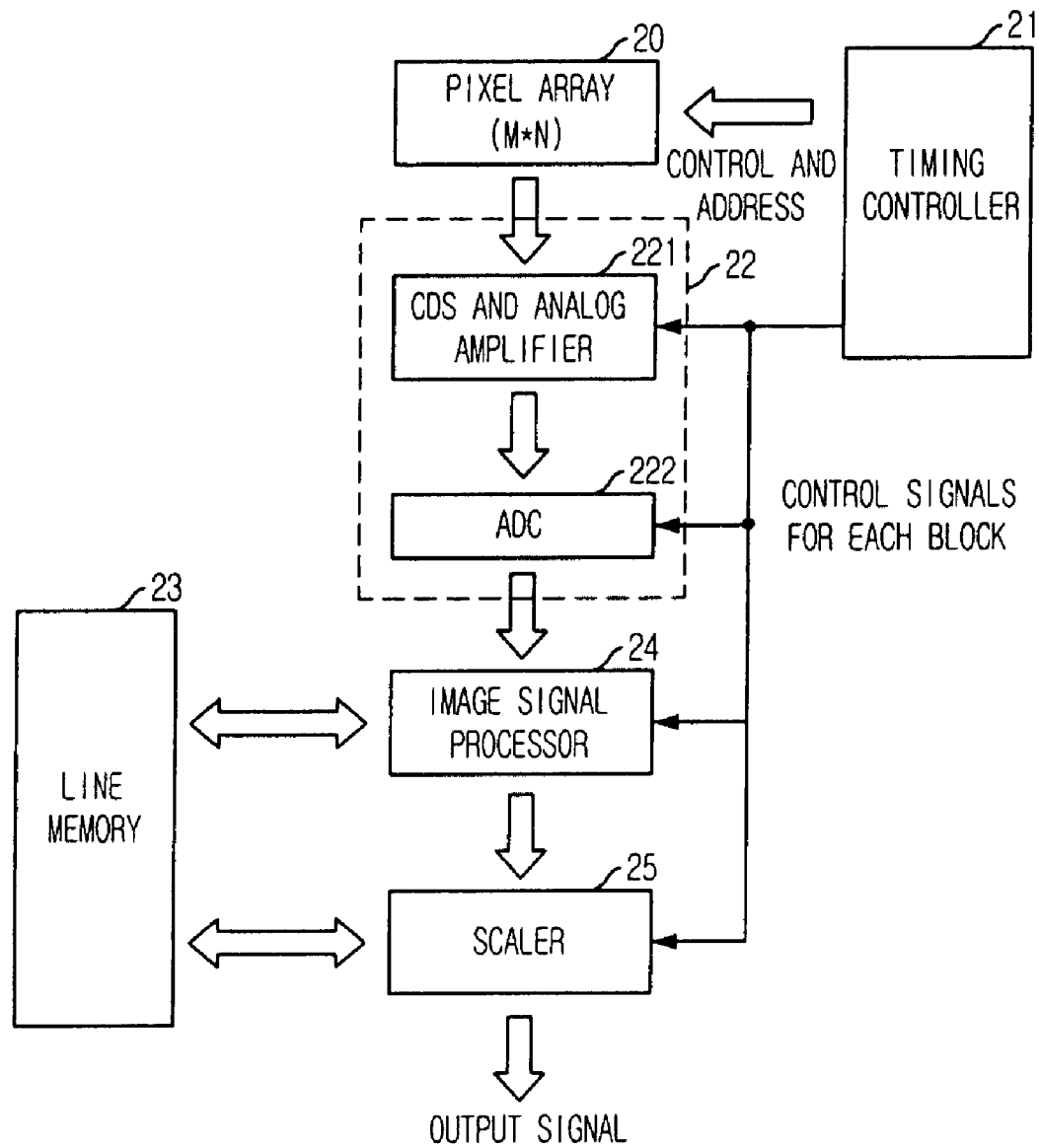
FIG. 2 is a block diagram of a CMOS image sensor in accordance with an embodiment of the present invention.

FIG. 2 is a block diagram of a CMOS image sensor in accordance with an embodiment of the present invention.

Referring to FIG. 2, the CMOS image sensor includes a pixel array 20 with M×N unit pixels (M and N are positive integers), a timing controller 21, an analog signal processor 22, an image signal processor 24, a line memory 23, and a scaler 25.

The analog signal processor 22 is provided with a CDS and analog amplifier 221, and a CDS 222.

The timing controller 21 is called a control and external system interface. The timing controller 11 controls an overall operation of the image sensor using an FSM and serves as an interface for an external system. Also, since the timing controller 21 has a batch register, it can program contents related to several internal operations and controls an overall chip operation according to the program information.

The pixel array 20 includes M×N unit pixels configured to maximize light-sensitive characteristics. The pixel array 20 is a core of the image sensor and detects information about an image inputted from the outside.

In the CDS and analog amplifier 221, the CDS removes a fixed pattern noise of a pixel using a CDS method, and the analog amplifier converts a pixel signal into an electric signal.

The ADC 222 converts an analog voltage detected by each pixel of the pixel array 20 into a digital voltage that can be processed at a digital system.

The line memory 23 stores the digital voltage of the pixel, which is converted by the ADC 222. The line memory 23 includes a plurality of lines for executing various functions of the image signal processor 24.

The image signal processor 24 executes several functions for improving the performance of the image sensor, based on the pixel output value stored in the line memory 23. Examples of the functions are a color interpolation, a color correction, a gamma correction, an auto white balance, an auto exposure, and so on.

The scaler 25 receives a scaling factor for adjusting the image size and calculates a scaling ratio. Then, the scaler 25 creates row/column address and data corresponding to the scaling ratio and outputs an image with a desired size.

Figure 3:
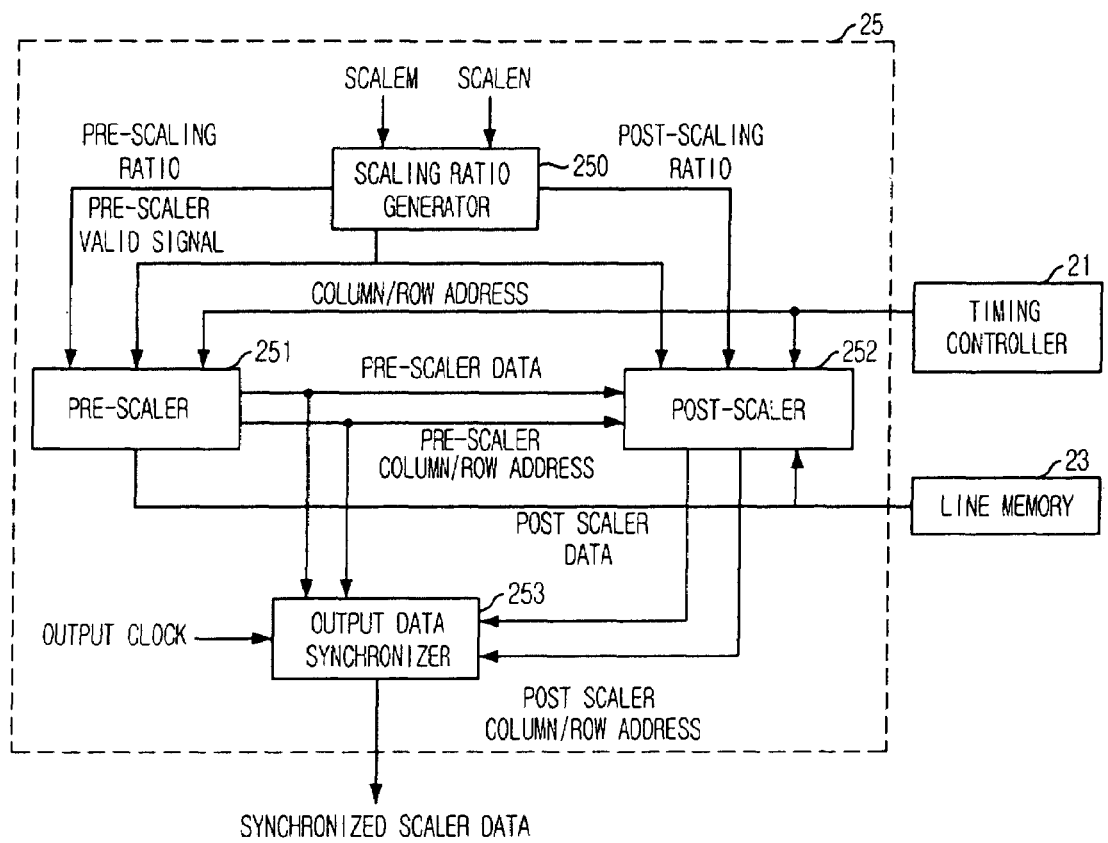
FIG. 3 is a block diagram of a scaler of FIG. 2.

FIG. 3 is a block diagram of the scaler 25 illustrated in FIG. 2.

Referring to FIG. 3, the scaler 25 includes a scaling ratio generator 250 for determining the scaling ratio according to the scaling factors SCALEM and SCALEN, a pre-scaler 251 for selectively executing the pre-scaling under control of the scaling ratio generator 250 and the timing controller 21, a post-scaler 252 for selectively executing the post-scaling with respect to the pre-scaled image and the non-pre-scaled image, and an output data synchronizer 253 for synchronizing the scaled image from the post-scaler 252 with the output clock of the image sensor.

An operation of the scaler 25 will be described in detail below.

The scaling ratio generator 250 calculates the scaling ratio using the scaling factors SCALEM and SCALEN. The scaling ratio is expressed as $$\text{Scaling ratio} = \text{SCALEM}/\text{SCALEN} \tag{1}$$

Also, the scaling ratio generator 250 determines a pre-scaler valid signal and a pre-scaling ratio according to the scaling ratio. The pre-scaler valid signal determines on/off operation of the pre-scaler 251.

Only when the pre-scaler valid signal is generated, the pre-scaler 251 generates pre-scaler row/column addresses according to the pre-scaling ratio calculated by the scaling ratio generator 250. Also, the pre-scaler 251 generates an image of an appropriate size by sampling only data located at positions matched with the generated addresses.

The post-scaler 252 adjusts a final image size of the image scaler 25. When not passing through the pre-scaler 251, the scaling ratio generated from the scaling ratio generator 250 becomes the post-scaling ratio and thus the size of the final image is adjusted according to the scaling ratio. On the contrary, when passing through the pre-scaler 251, the post-scaling ratio of the post-scaler 252 is given by $$\text{Post scaling ratio} = [(\text{SCALEM}/\text{SCALEN})/\text{Scaling ratio}] \tag{2}$$

When the pre-scaler 251 is off, the post-scaler 252 receives the row/column addresses from the timing controller 21 to generate new row/column addresses according to the post-scaling ratio. On the contrary, when the pre-scaler 251 is on, the post-scaler 252 receives the row/column addresses from the pre-scaler 251 to generate new row/column addresses according to the post-scaling ratio.

Since the output timing of the image sensor due to the post-scaler 252 is not constant, the output data synchronizer 253 receives image data of the post scaler 252 and then synchronizes the scaled image data with the output clock of the image sensor.

Figure 4:
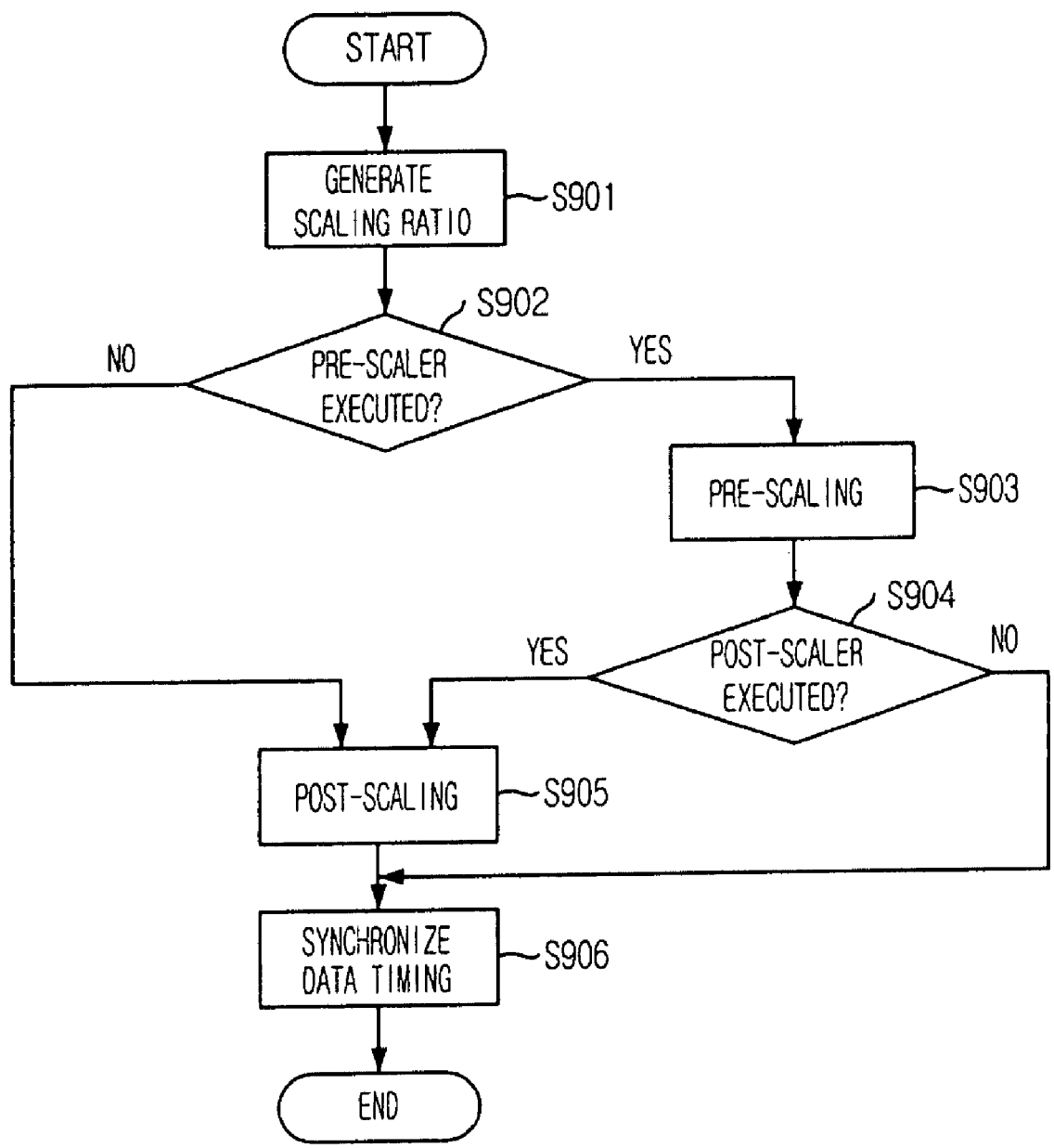
FIG. 4 is a flowchart diagram illustrating an image scaling algorithm of the scaler in FIG. 2.

FIG. 4 is a flowchart diagram illustrating an image scaling algorithm of the scaler of FIG. 2.

Referring to FIG. 4, in the step S901, if scaling factors SCALEM and SCALEN for outputting an image with a desired size are transferred through the timing controller 21, a scaling ratio is generated. Then, in step S902, it is determined whether to execute a pre-scaler according to the scaling ratio.

In step S903, if it is determined that the pre-scaler is necessary to execute, a pre-scaling using the pre-scaler is performed to adjust the image size. Then, in step S904, it is determined whether the post-scaler is necessary to execute. In step S905, if the post-scaler is necessary to execute, a post-scaling is performed through the post-scaler to adjust the image size. If the post-scaler is unnecessary to execute, the image size obtained through the pre-scaling is finally outputted.

On the contrary, if it is determined in step S902 that the pre-scaling is not unnecessary to execute, the pre-scaling is bypassed and the image size obtained through the post-scaling in step S905 is finally outputted.

In step S906, the image data scaled through the pre-scaling and the post-scaling is synchronized with the output clock of the image sensor. That is, data timing synchronization process is performed.

Figure 5:
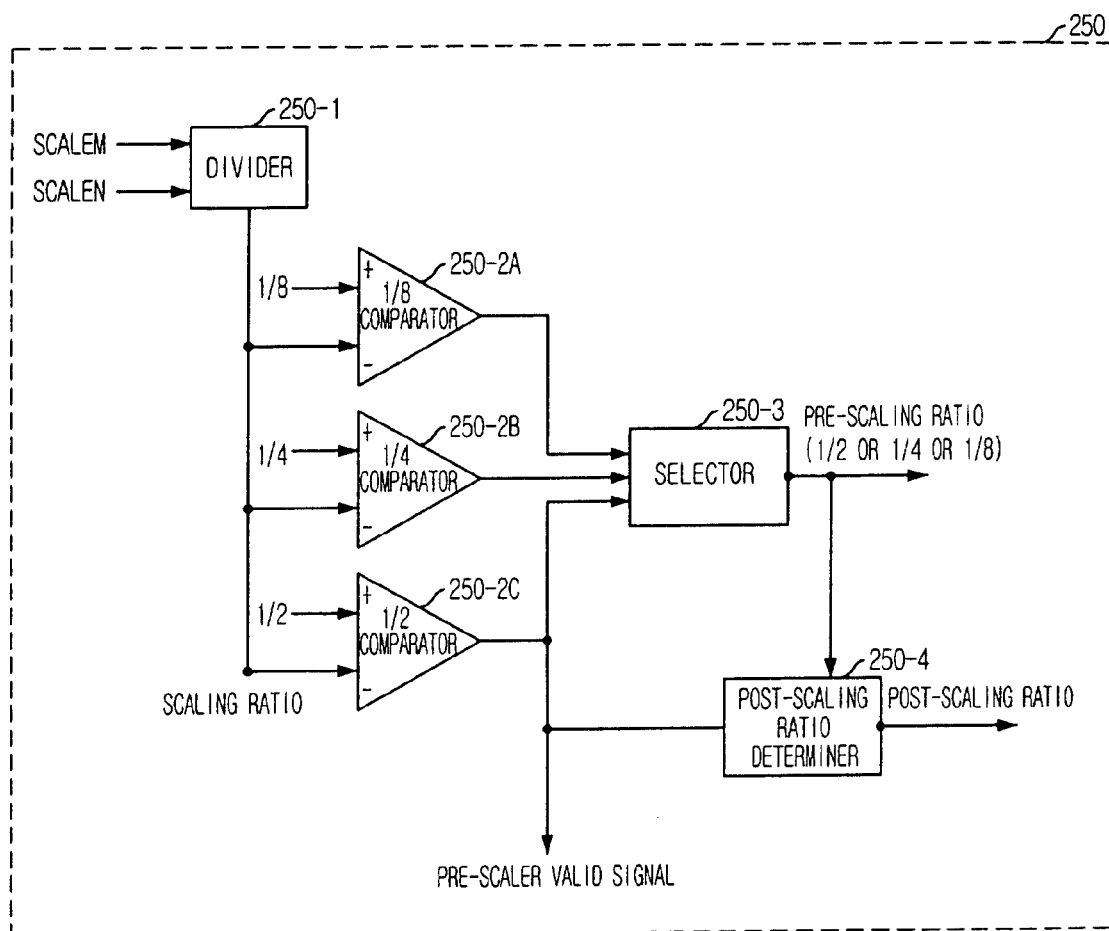
FIG. 5 is a block diagram of a scaling ratio generator of in FIG. 3.

FIG. 5 is a block diagram of the scaling ratio generator 250 illustrated in FIG. 3.

Referring to FIG. 5, the scaling ratio generator 250 includes a divider 250-1, a plurality of comparators 250-2A to 250-2C, a selector 250-3, a post-scaling ratio determiner 250-4. The divider 250-1 outputs the scaling ratio given by dividing SCALEM by SCALEN using the scaling factor. The plurality of comparators 250-2A to 250-2C have different reference values ranging from 1/2 to 1/8 for comparing the scaling ratio with a preset scaling ratio. The selector 250-3 outputs the corresponding pre-scaling ratio among the outputs of the comparators 250-2A to 250-2C. The post-scaling ratio determiner 250-4 determines the post-scaling ratio using the pre-scaling valid signal (the output of the comparator 250-2C having the scaling ratio reference value of 1/2) and the selected pre-scaling ratio.

Although the post-scaler 250 having the scaling ratio of 1 to 1/8 has been described in the above embodiment, the present invention can also be applied to a greater or smaller scaling ratio.

An operation of the post-scaler 250 will be described below in detail.

The divider 250-1 calculates the scaling ratio by dividing the scaler factor SCALEM by the scaler factor SCALEN. The scaling ratio outputted from the divider 250-1 is inputted to negative (−) terminals of the comparators 250-2A to 250-2C having the reference values 1/2, 1/4, and 1/8, respectively.

When the scaling ratio is greater than 1/2, the outputs of all the comparators 250-2A to 250-2C are a logic low and the scaler valid signal is also a logic low. Consequently, the pre-scaler 251 is turned off. At this point, the scaling ratio becomes SCALEM/SCALEN.

When the scaling ratio is less than or equal to 1/2 and greater than 1/4, the output of only the 1/2 comparator 250-2C is a logic high. The pre-scaling ratio becomes 1/2. At this point, the post-scaling ratio becomes (SCALEM/SCALEN)/(1/2).

When the scaling ratio is less than or equal to 1/4 and greater than 1/8, the outputs of only the 1/2 comparator 250-2C and the 1/4 comparator 250-2B are a logic high. The pre-scaling ratio becomes 1/4. At this point, the post-scaling ratio becomes (SCALEM/SCALEN)/(1/4).

When the scaling ratio is greater than 1/2, the scaler valid signal is a logic low. When the scaling ratio is less than or equal to 1/2, the post-scaling ratio is a logic high.

Figure 6:
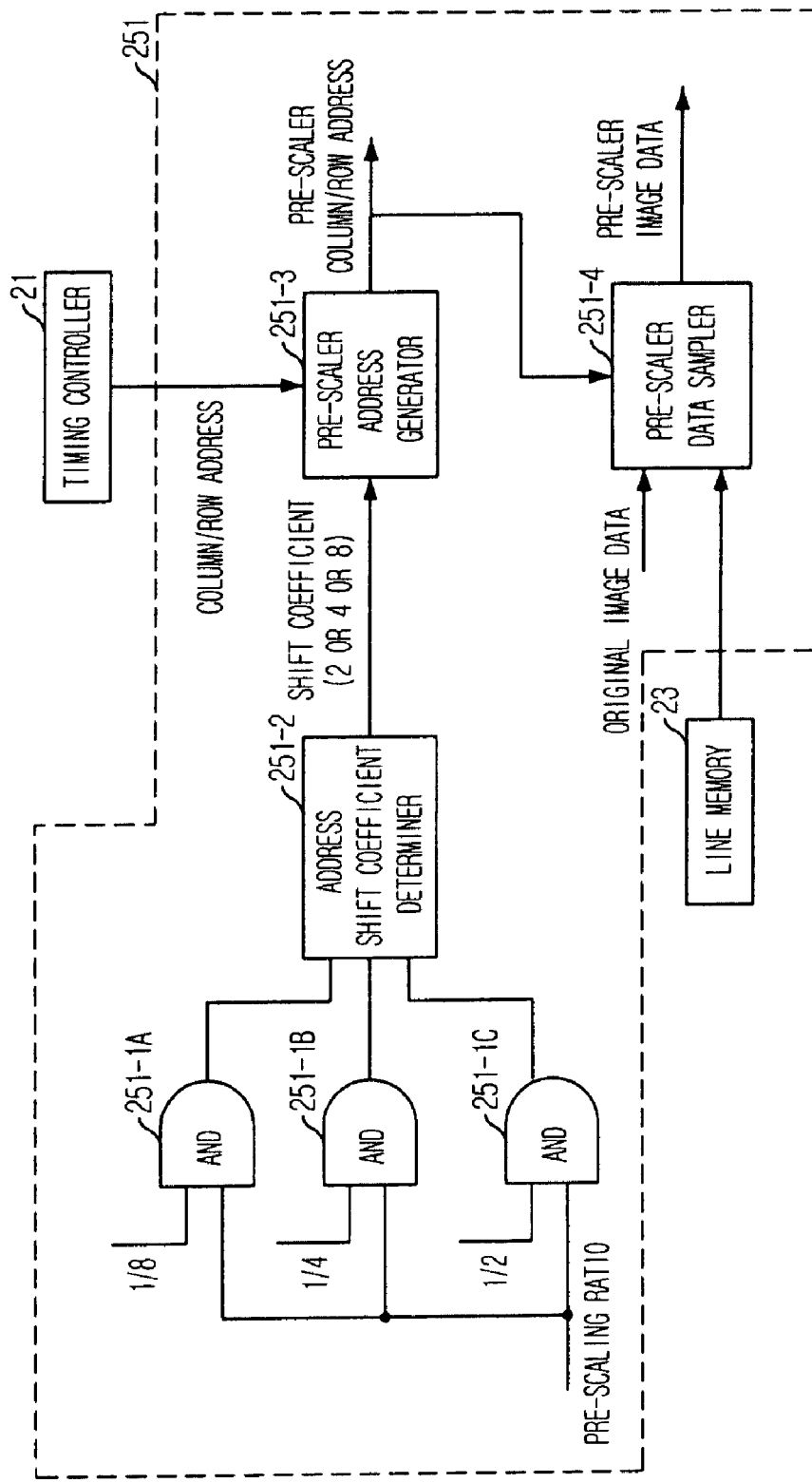
FIG. 6 is a block diagram of a pre-scaler of FIG. 3.

FIG. 6 is a block diagram of the pre-scaler 251 illustrated in FIG. 3.

Referring to FIG. 6, the pre-scaler 251 includes a plurality of AND gates 251-1A to 251-1C, an address shift coefficient selector 251-2, a pre-scaler address generator 251-3, and a pre-scaler data sampler 251-4. The AND gate 251-1A has one terminal receiving the reference value of 1/8 and another terminal receiving the pre-scaling ratio, the AND gate 251-1B has one terminal receiving the reference value of 1/4 and another terminal receiving the pre-scaling ratio, and the AND gate 251-1C has one terminal receiving the reference value of 1/2 and another terminal receiving the pre-scaling ratio. The address shift coefficient selector 251-2 selects the shift coefficient of the corresponding address using the outputs of the AND gates 251-1A to 251-1C. The pre-scaler address generator 251-3 generates the pre-scaler row/column addresses by shifting the addresses from the timing controller 21 as much as the corresponding coefficient selected by the address shift coefficient selector 251-2. The pre-scaler data sampler 251-4 samples the original image data and the data stored in the line memory 23 through the pre-scaler row/column addresses and outputs the pre-scaler image data.

The pre-scaler 251 operates only when the scaler valid signal is a logic high, and shits the row/column addresses provided from the timing controller 21 in each bit according to the pre-scaling ratio determined by the scaler ratio generator 250. That is, a 1-bit shift is performed when the scaling ratio is 1/2, a 2-bit shift is performed when the scaling ratio is 1/4, and a 3-bit shift is performed when the scaling ratio is 1/8. Through this shift process, the pre-scaler row/column addresses are generated.

Meanwhile, even in the same pre-scaling ratio, the pre-scaler row/column addresses are differently generated when the image scaler is performed in the full color data level and in the bayer data level.

By outputting only data located at positions matched with the pre-scaler address position, which is newly constructed among the original image data through the pre-scaler data sampler 251-4, the output data of the image sensor can be implemented to match with the pre-scaling ratio.

In various manners, the output data of the pre-scaler 251 can be determined using the data of the previous line and the currently inputted data through the line memory 23 at the position where the address is matched.

Accordingly, the image quality of the pre-scaler output image is determined by the method of determining the output data.

Figure 7:
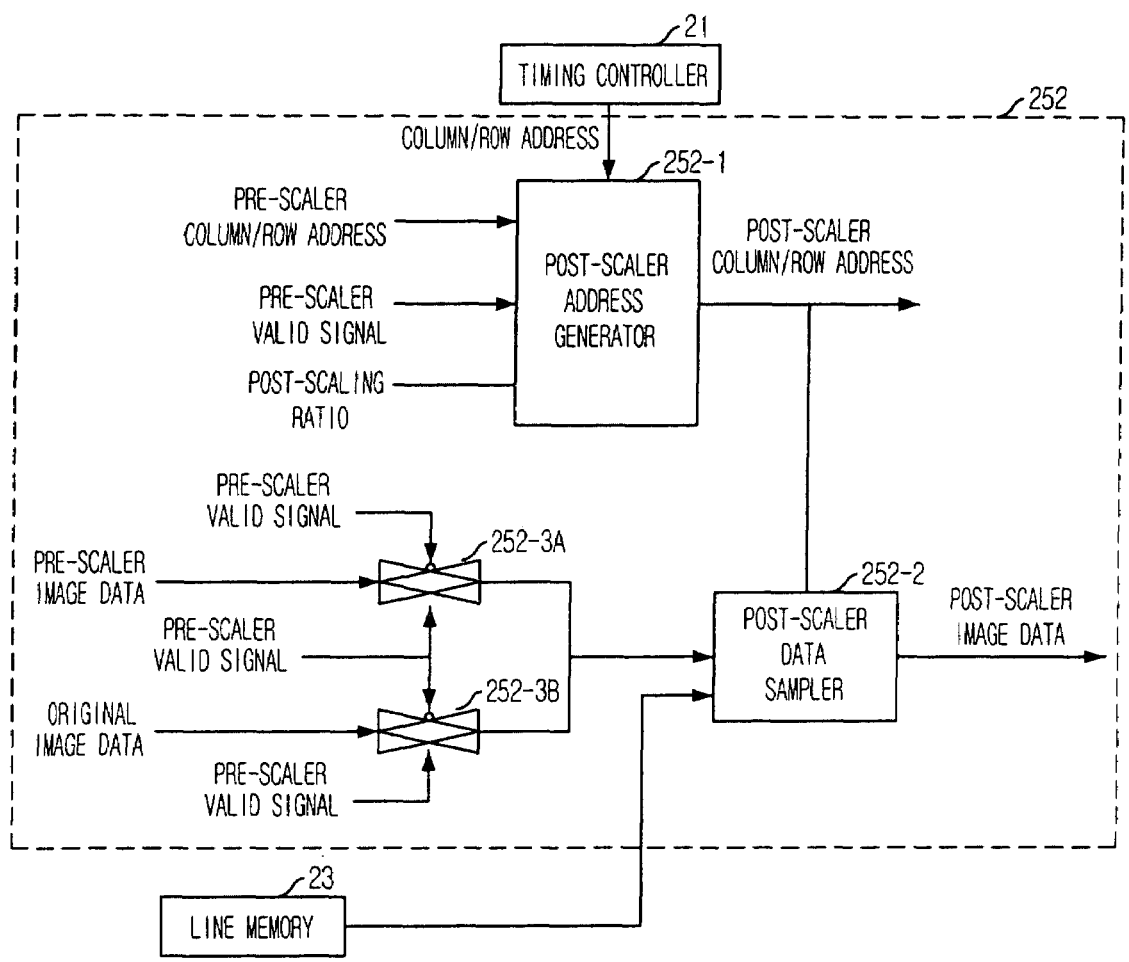
FIG. 7 is a block diagram of a post-scaler of FIG. 3.

FIG. 7 is a block diagram of the post-scaler 252 illustrated in FIG. 3.

Referring to FIG. 7, the post-scaler 252 includes a post-scaler address generator 252-1, transmission gates 252-3A and 252-3B, and a post-scaler data sampler 252-2. The post-scaler address generator 252-1 receives the row/column addresses from the timing controller 21, the pre-scaler row/column addresses, the pre-scaler valid signal, and the post-scaling ratio and generates the post-scaler row/column addresses. The transmission gate 252-3A receives the pre-scaler valid signal and its inverted signal through gates of NMOS and PMOS transistors and outputs the pre-scaler image data. The transmission gate 252-3B receives the pre-scaler valid signal and its inverted signal through gates of NMOS and PMOS transistors and outputs the original image data. The post-scaler data sampler 252-2 samples the original image data or the pre-scaler image data through the post-scaler row/column addresses and outputs the post-scaler image data.

The post-scaler address generator 252-1 selects one of the pre-scaler row/column post-scaling ratio and the row/column address of the entire size of the image sensor, which is generated by the timing controller 21 by using the post-scaling ratio and the pre-scaling valid signal in Eqs. (1) and (2), and then generates the post-scaler row/column addresses. At this point, like in the pre-scaler 251, the post-scaler row/column addresses are differently generated when the image scaler is performed in the full color data level and in the bayer data level.

Also, like the pre-scaler data sampler 251-3, the post-scaler address generator 252-2 selects one of the original image data and the pre-scaler image data according to the pre-scaler valid signal and outputs data at the position matched with the new post-scaler address. The image quality of the post-scaler output image is determined by the method of outputting the output data.

Figure 8A:
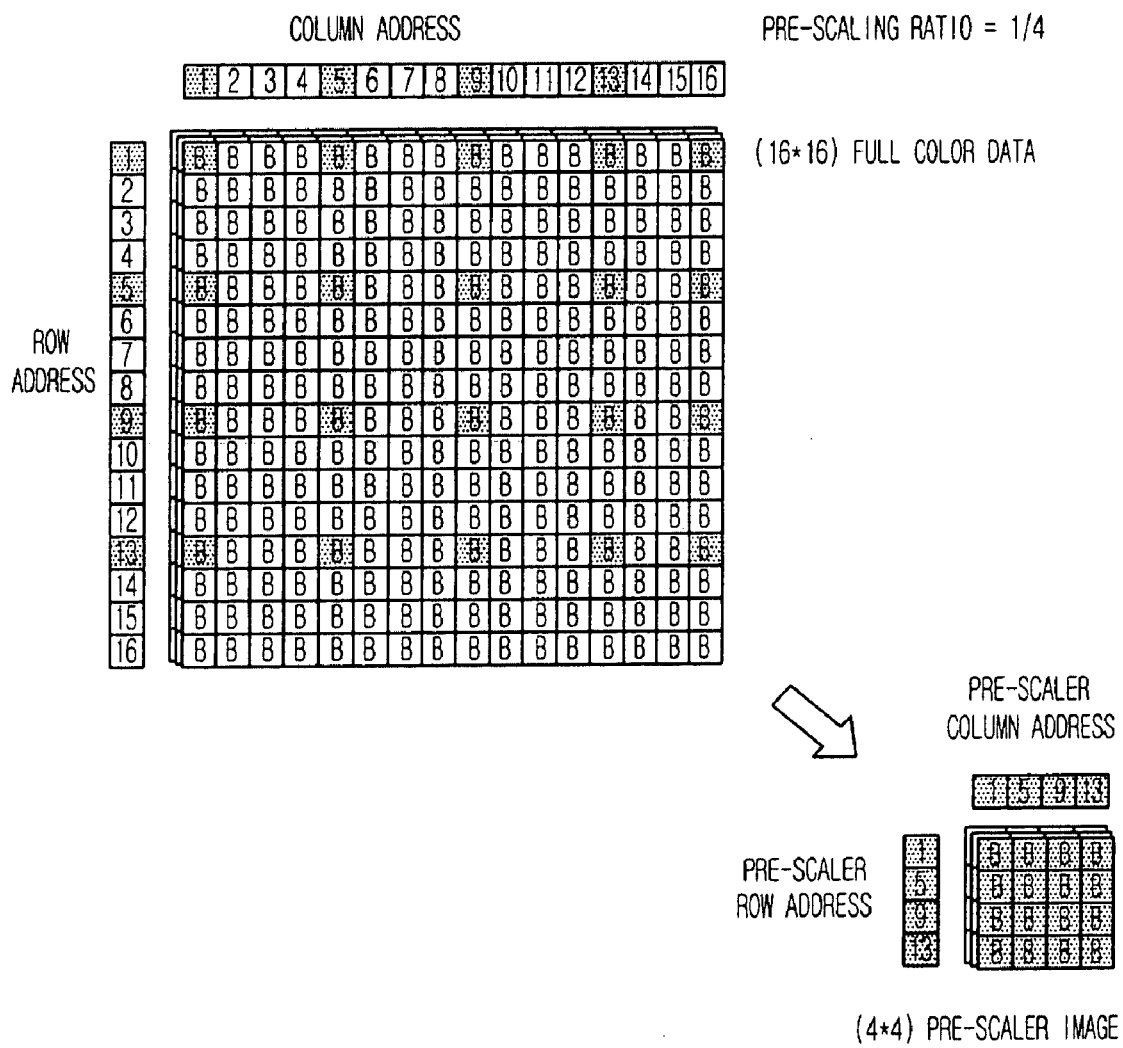
FIG. 8A illustrates an output of the pre-scaler in a full color data level when the pre-scaling ratio is 1/4.
Figure 8B:
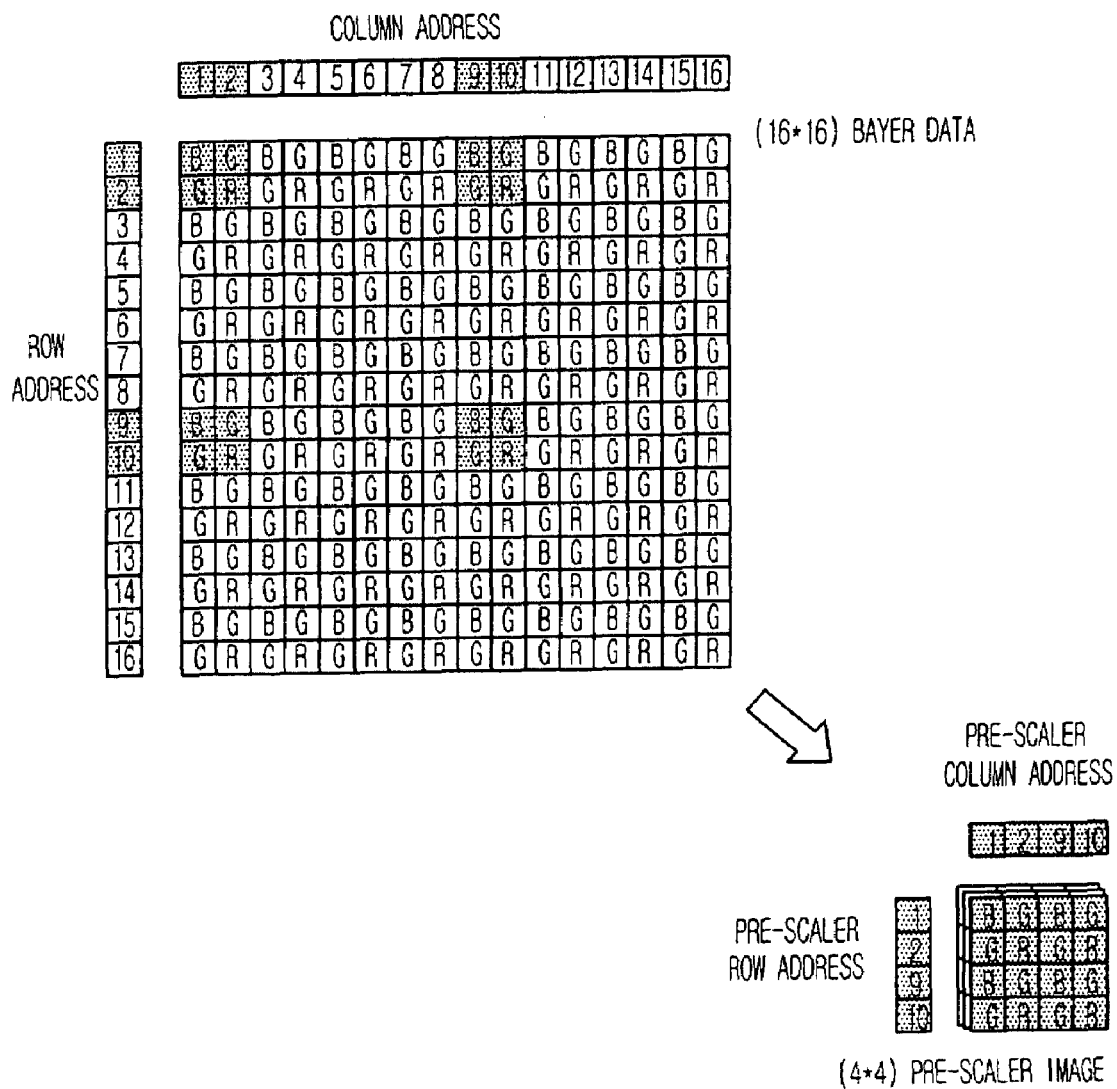
FIG. 8B illustrates an output of the pre-scaler in a bayer data level when the pre-scaling ratio is 1/4.

FIG. 8A illustrates the output of the pre-scaler in the full color data level when the pre-scaling ratio is 1/4, and FIG. 8B illustrates the output of the pre-scaler in the bayer data level when the pre-scaling ratio is 1/4.

Specifically, FIGS. 8A and 8B illustrate a case where the pre-scaling ratio is 1/4 with respect to a 16×16 pixel array. Even though the pre-scaling ratios are equal to 1/4, the pre-scaler row/column address is (1,5,9,13) in the full color data level and (1,2,9,10) in the bayer level, whereby the pre-scaler addresses are differently implemented.

Consequently, the data of the positions matched with the row/column addresses are outputted as the output data of the pre-scaler 251.

Figure 9A:
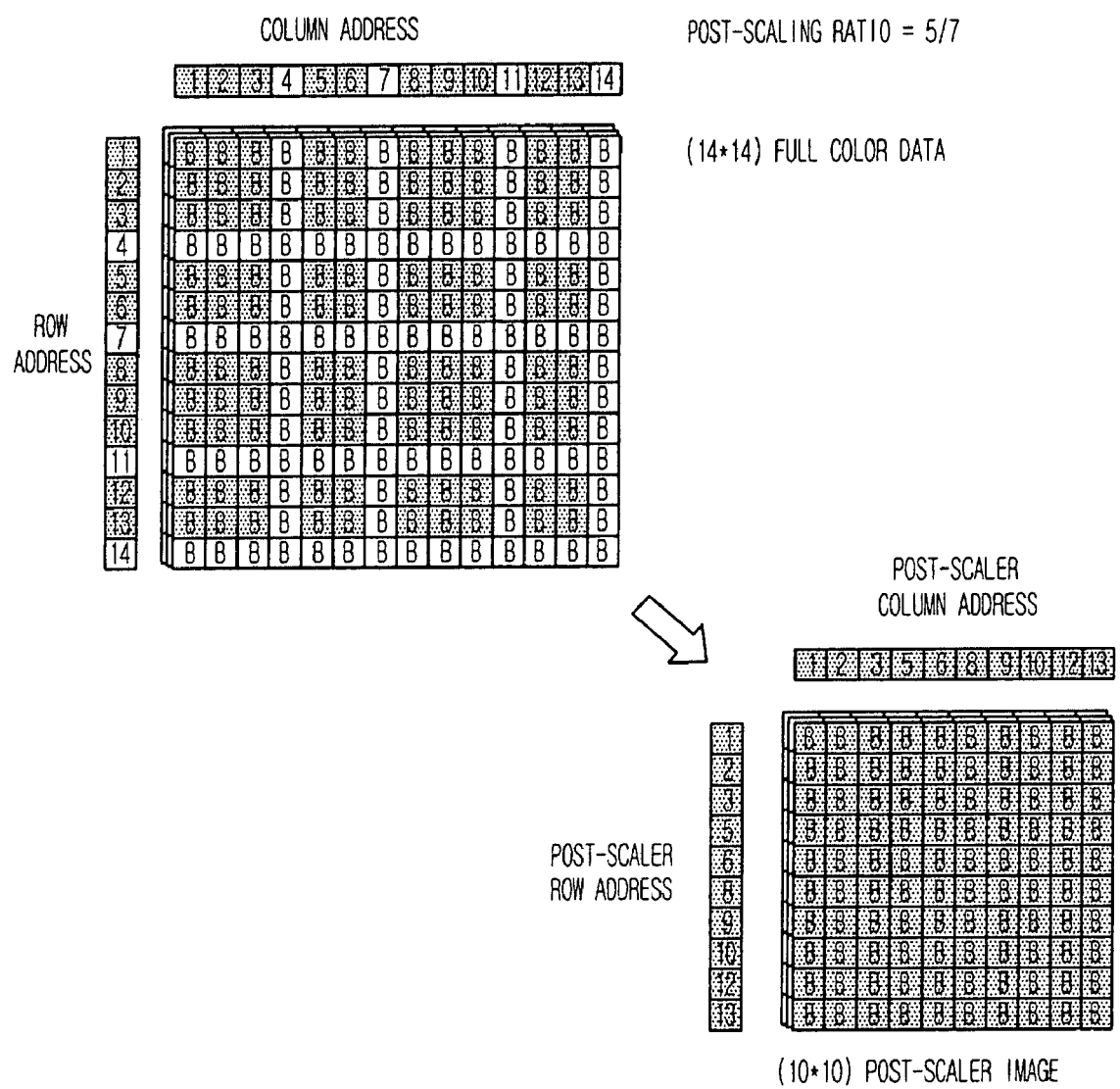
FIG. 9A illustrates an output of the post-scaler in a full color data level when the post-scaling ratio is 5/7 with respect to a post 14×14 pixel array.
Figure 9B:
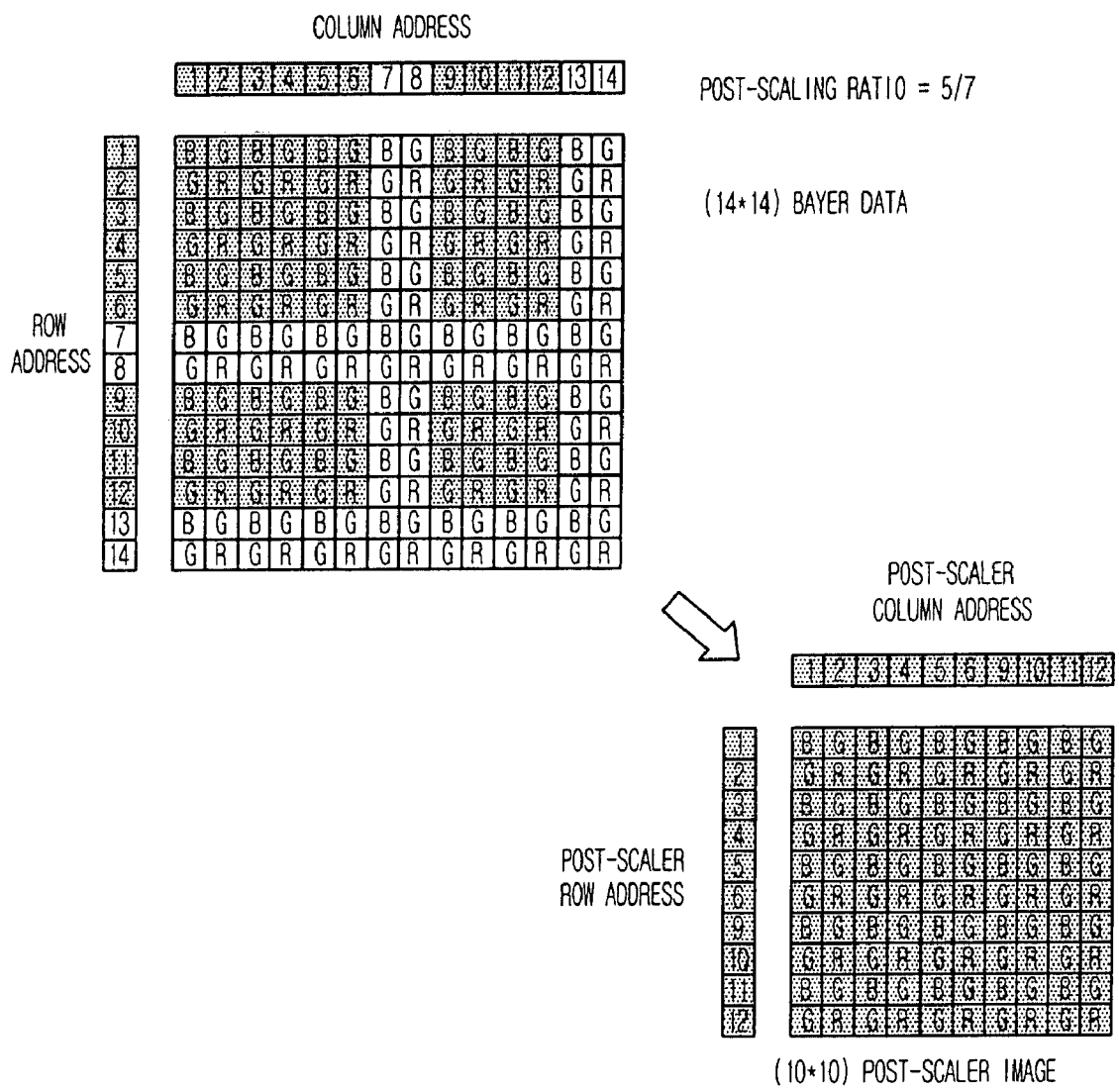
FIG. 9B illustrates an output of the post-scaler in a bayer data level when the post-scaling ratio is 5/7 with respect to a post 14×14 pixel array.

FIG. 9A illustrates an output of the post-scaler in a full color data level when the post-scaling ratio is 5/7 with respect to a post 14×14 pixel array, and FIG. 9B illustrates an output of the post-scaler in a bayer data level when the post-scaling ratio is 5/7 with respect to a post 14×14 pixel array.

Even though the post-scaling ratios are equal to 5/7, the row/column addresses is (1,2,3,5,6,8,9,10,12,13) in the full color data level and (1,2,3,4,5,6,9,10,11,12) in the bayer data level, whereby the post-scaler addresses are differently implemented.

When the post-scaling ratio is greater than 1/2, it does not pass through the pre-scaler. When the scaling ratio is less than 1/2, it passes through the pre-scaler and is newly constructed like Eqs. (1) and (2). Therefore, the post-scaling ratio is always in a range from 1 to 1/2.

For example, when the scaling ratio is 3/7, the pre-scaling ratio becomes 1/2 and the post-scaling ratio becomes 6/7 by Eq. (2). When the scaling ratio is 6/7, the post-scaling ratio becomes 6/7 by Eq. (1).

Therefore, when the scaling ratio is 3/7 and 6/7, the post-scaling ratio becomes 6/7 in both cases.

Like this, since the scaler method of the present invention can share the same post-scaling ratio, the post-scaler can be implemented in the same configuration, thereby reducing the complexity of hardware.

The output data synchronizer 253 acts as a first input first out (FIFO) that synchronizes the image scaler output data with a random period, which is outputted from through the post-scaler, with the output clock of the image sensor and then outputs the data at a constant period. The output data synchronizer 253 is configured with a plurality of line memories. Also, the output data synchronizer 253 constantly matches the intervals of the respective lines, as well as the constant period of the output data of the image sensor.

Figure 10:
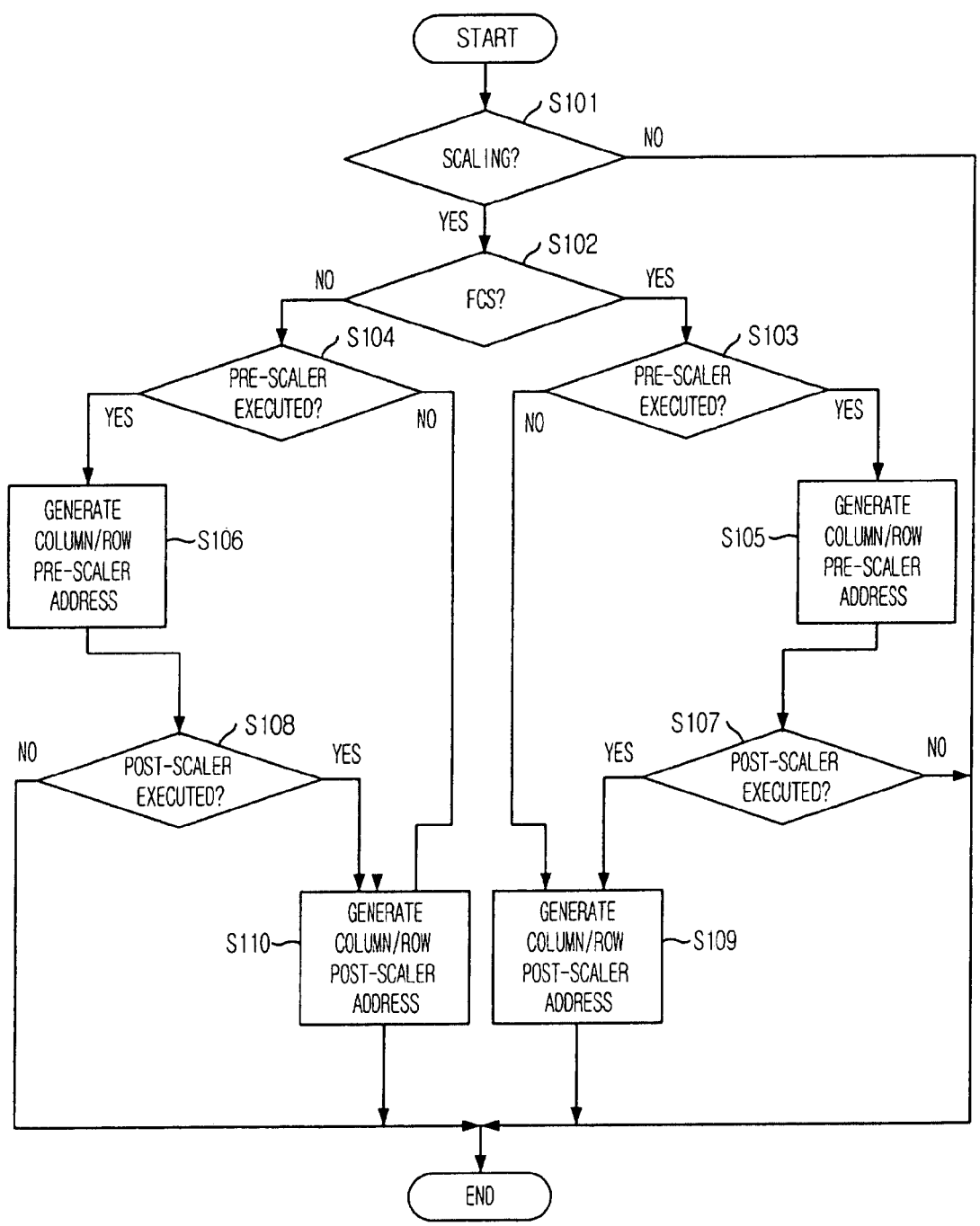
FIG. 10 is a flowchart diagram illustrating an algorithm of generating row/column addresses for the image scaling.

FIG. 10 is a flowchart diagram illustrating an algorithm of generating row/column addresses for the image scaling.

Referring to FIG. 10, in step S101, it is determined whether an image scaler is executed or not. If the image scaling is unnecessary, the row/column addresses are unnecessary to generate. Therefore, the row/column addresses from the timing controller are outputted without change.

In this case, the size of the output image from the pixel array is identical to that of the output image from the image sensor.

On the contrary, in step S102, if the image scaling is necessary, it is determined whether the scaling is executed in a full color RGB data level or a bayer mosaic pattern data level. The scaling in the full color RGB data level is referred to as a full color scaling (FCS), and the scaling in the bayer mosaic pattern data level is referred to as a bayer mosaic scaling (BMS).

Unlike the full color data, the bayer data has one color information per pixel in B/Gb or R/Cr line. Therefore, an address of the B/Gb or R/Gr pixel has to be generated at the same time. Thereafter, when the pre-scaling is executed according to the scaling ratio, the row/column addresses for the pre-scaling are generated and used in the pre-scaler. Also, when the post-scaling is executed, the row/column addresses for the post-scaling are generated and used in the post-scaler.

When the FCS or BMS is selected in step S102, the row/column addresses for the pre-scaling and the post-scaling are generated through steps S103 to S109.

In accordance with the present invention, arbitrary scaling factors (SCALEM, SCALEN) are received and the scaling ratio (=SCALEM/SCALEN) is determined through the scaling ratio generator. Then, the row/column addresses of the entire size of the image generated by the timing controller are reconfigured using the row/column addresses corresponding to the scaling ratio. Consequently, only data located at positions matched with the row/column addresses newly generated are outputted.

The image size can be arbitrarily adjusted through the pre-scaler and the post-scaler. When the scaling ratio is greater than 1/2, the pre-scaler is off and the image size is adjusted only by the post-scaler.

Since the size of the output image of the image sensor can be arbitrarily changed according to the scaling ratio, the image size can be adjusted according to the requirement of an image displaying system such as the digital camera or mobile phone.

Typically, in case that a scaling ratio is small, a whole image size should be converted to a very small size. Thus, damage in an image is generated. However, in case that the scaling ratio is small, a pre-scaler serves a role in controlling an image size to a medium size of the scaling ratio to reduce the damage in the image.

Therefore, it is possible to satisfy the technical requirements of the high image quality/high resolution of the capture image and the small-sized image display. Thus, it is easy to adjust the image size regardless of the size of the original image in the image sensor.

Also, the hardware of the scaler can be simplified by separately installing the pre-scaler and the post-scaler depending on the scaling ratio, thereby increasing the degree of integration.

Although the CMOS image sensor has been taken as an example, the present invention can also be applied to various kinds of image sensors.

The present application contains subject matter related to the Korean patent application No. KR 2005-0015506, filed in the Korean Patent Office on Feb. 24, 2005, the entire contents of which being incorporated herein by reference.

While the present invention has been described with respect to the particular embodiments, it will be apparent to those skilled in the art that various changes and modifications may be made without departing from the scope of the invention as defined in the following claims.

What is claimed is:

1. An image sensor, comprising:
a timing controller for controlling an overall operation of the image sensor;
a line memory for storing digital signals corresponding to a plurality of images in line unit;
an image signal processor for processing the plurality of images by using the corresponding digital signal stored in the line memory so as to improve performance of the image sensor; and
a scaler for generating a corresponding row/column address by calculating a scaling ratio according to a scaling factor of a desired image size from the timing controller, to scale the corresponding image, wherein the corresponding image of the desired size is outputted through a pre-scaler and a post-scaler coupled to each other in the image sensor and selectively executed according to the scaling ratio, wherein the scaler includes:

a scaling ratio generator for determining the scaling ratio using the scaling factor;

the pre-scaler for selectively executing a pre-scaling under control of the scaling ratio generator and the timing controller;

the post-scaler for selectively executing a post-scaling with respect to the pre-scaled image and a non-pre-scaled image; and an output data synchronizer for synchronizing the scaled image data from the post-scaler with an output clock of the image sensor, and wherein the post-scaler includes:

a post-scaler address generator for receiving row/column addresses from the timing controller, pre-scaler row/column addresses, a pre-scaler valid signal, and a post-scaling ratio and generating post-scaler row/column addresses;

first and second transmission gate for receiving the pre-scaler valid signal and inverted signal thereof through NMOS and PMOS gates and outputting pre-scaler image data and original image data, respectively; and a post-scaler data sampler for sampling the original image data or the pre-scaler image data through the post-scaler row/column addresses and outputting post-scaler image data.

2. The image sensor of claim 1, wherein the scaler determines whether to execute the pre-scaling according to the scaling ratio and selectively executes the pre-scaling to primarily adjust the image size, and determines whether to execute the post-scaling and selectively executes the post-scaling.

3. The image sensor of claim 2, wherein, when the desired image size is M×N, where M represents the number of columns and N represents the number of rows, and M and N are positive integers, the scaling ratio is SCALEM/SCALEN, where SCALEM and SCALEN are the scaling factors.

4. The image sensor of claim 3, wherein the scaling ratio generator determines the pre-scaler valid signal and the pre-scaling ratio according to the scaling ratio, and the pre-scaler valid signal determines an on/off operation of the pre-scaler.

5. The image sensor of claim 4, wherein the pre-scaler generates a pre-scaler row/column address according to the pre-scaling ratio only when the pre-scaler valid signal is generated, and generates an image of the pre-scaled size by sampling only data located at position matched with the pre-scaler row/column address in the line memory.

6. The image sensor of claim 5, wherein when the pre-scaler is not executed, the scaling ratio from the scaling ratio generator is used as the post-scaling ratio in the post-scaler, and when the pre-scaler is executed, the post-scaling ratio becomes, where SCALEM and SCALEN are the scaling factor.

7. The image sensor of claim 6, wherein when the pre-scaler is off, the post-scaler receives row/column address from the timing controller and generates new row/column address corresponding to the scaling ratio, and when the pre-scaler is on, the post-scaler receives address from the pre-scaler and generates new row/column address corresponding to the post-scaling ratio.

8. The image sensor of claim 4, wherein the scaling ratio generator includes:

a divider for dividing the scaling factor (SCALEM) by the scaling factor (SCALEN) and outputting the resulting value as the scaling ratio;

a plurality of comparators for comparing the scaling ratio with a preset scaling ratio, the comparators having different reference values;

a selector for outputting a corresponding pre-scaling ratio among the outputs of the comparators; and a post-scaling ratio determiner for determining the post-scaling ratio using the pre-scaling valid signal output from a one of the plurality of the comparators having a scaling reference value of ½, and the selected pre-scaling ratio.

9. The image sensor of claim 5, wherein the pre-scaler operates only when the scaler valid signal is a logic high, and shifts the row/column address from the timing controller according to the pre-scaling ratio determined by the scaler ratio generator.

10. The image sensor of claim 9, wherein even when the shift coefficients are equal, the pre-scaler has different pre-scaler row/column addresses in a full color data level and a bayer data level.

11. The image sensor of claim 9, wherein the pre-scaler includes:

a plurality of AND gates having one terminal for receiving different reference values and having another terminal for receiving the pre-scaling ratio;

an address shift coefficient selector for selecting a shift coefficient of a corresponding address through the outputs of the AND gates;

a pre-scaler address generator for generating the pre-scaler row/column addresses by shifting the addresses from the timing controller as much as the corresponding coefficient selected by the address shift coefficient selector; and a pre-scaler data sampler for sampling the original image data and the data stored in the line memory through the pre-scaler row/column addresses and outputting the pre-scaler image data.

12. The image sensor of claim 7, wherein even when the shift coefficients are equal, the post-scaler has different post-scaler row/column addresses in a full color data level and a bayer data level.

* * * * *